United States Patent
Hugers

(10) Patent No.: US 7,630,070 B2
(45) Date of Patent: Dec. 8, 2009

(54) SCATTEROMETER, A LITHOGRAPHIC APPARATUS AND A FOCUS ANALYSIS METHOD

(75) Inventor: Ronald Franciscus Herman Hugers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 13 days.

(21) Appl. No.: 11/998,454

(22) Filed: Nov. 30, 2007

(65) Prior Publication Data

US 2008/0151228 A1    Jun. 26, 2008

Related U.S. Application Data

(63) Continuation-in-part of application No. 11/635,787, filed on Dec. 8, 2006, now abandoned.

(51) Int. Cl.
*G01N 21/00* (2006.01)
(52) U.S. Cl. .............. 356/237.2; 356/237.6; 356/445; 356/601; 250/300; 250/311
(58) Field of Classification Search ... 356/237.2–237.6; 250/300–311
See application file for complete search history.

(56) References Cited

U.S. PATENT DOCUMENTS

| | | | | |
|---|---|---|---|---|
| 3,912,922 | A | 10/1975 | Lacotte et al. | 250/204 |
| 4,577,095 | A | 3/1986 | Watanabe | 250/201 |
| 4,725,722 | A | 2/1988 | Maeda et al. | 250/201 |
| 5,202,748 | A | 4/1993 | MacDonald et al. | 356/508 |
| 5,245,173 | A | 9/1993 | Yamana et al. | 250/201.3 |
| 5,703,692 | A | 12/1997 | McNeil et al. | 356/445 |
| 5,880,838 | A | 3/1999 | Marx et al. | 356/351 |
| 5,963,329 | A | 10/1999 | Conrad et al. | 356/372 |
| 6,545,789 | B1 | 4/2003 | Lemasters | 359/227 |
| 6,580,502 | B1 | 6/2003 | Kuwabara | 356/237.3 |
| 6,608,690 | B2 | 8/2003 | Niu et al. | 356/635 |
| 6,657,216 | B1 | 12/2003 | Poris | 250/559.22 |
| 6,699,624 | B2 | 3/2004 | Niu et al. | 430/5 |
| 6,704,661 | B1 | 3/2004 | Opsal et al. | 702/27 |
| 6,721,691 | B2 | 4/2004 | Bao et al. | 702/189 |

(Continued)

FOREIGN PATENT DOCUMENTS

DE    28 36 428 A1    8/1978

(Continued)

OTHER PUBLICATIONS

European Search Report issued for European Patent Application No. 07254693.0, dated Mar. 27, 2008.

*Primary Examiner*—Gregory J Toatley, Jr.
*Assistant Examiner*—Iyabo S Alli
(74) *Attorney, Agent, or Firm*—Sterne, Kessler, Goldstein & Fox P.L.L.C.

(57) ABSTRACT

To detect whether a substrate is in a focal plane of a scatterometer, a cross-sectional area of radiation above a certain intensity value is detected both in front of and behind a back focal plane of the optical system of the scatterometer. The detection positions in front of and behind the back focal plane should desirably be equidistant from the back focal plane along the path of the radiation redirected from the substrate so that a simple comparison may determine whether the substrate is in the focal plane of the scatterometer.

25 Claims, 7 Drawing Sheets

U.S. PATENT DOCUMENTS

| | | |
|---|---|---|
| 6,738,138 B2 | 5/2004 | Wei .............................. 356/369 |
| 6,753,961 B1 | 6/2004 | Norton et al. ............... 356/364 |
| 6,768,983 B1 | 7/2004 | Jakatdar et al. .............. 706/46 |
| 6,772,084 B2 | 8/2004 | Bischoff et al. ............. 702/127 |
| 6,785,638 B2 | 8/2004 | Niu et al. .................... 702/189 |
| 6,813,034 B2 | 11/2004 | Rosencwaig et al. ........ 356/601 |
| 6,819,426 B2 | 11/2004 | Sezginer et al. ............. 356/401 |
| 6,856,408 B2 | 2/2005 | Raymond .................... 356/601 |
| 6,919,964 B2 | 7/2005 | Chu ............................ 356/601 |
| 6,928,628 B2 | 8/2005 | Seligson et al. ................ 716/4 |
| 6,972,852 B2 | 12/2005 | Opsal et al. ................. 356/625 |
| 6,974,962 B2 | 12/2005 | Brill et al. ................... 250/548 |
| 6,987,572 B2 | 1/2006 | Lakkapragada et al. ..... 356/601 |
| 7,005,641 B2 * | 2/2006 | Nakasuji et al. ............. 250/310 |
| 7,046,376 B2 * | 5/2006 | Sezginer ...................... 356/601 |
| 7,061,615 B1 | 6/2006 | Lowe-Webb ................ 356/401 |
| 7,061,623 B2 | 6/2006 | Davidson .................... 356/497 |
| 7,061,627 B2 | 6/2006 | Opsal et al. ................. 356/601 |
| 7,068,363 B2 | 6/2006 | Bevis et al. ............... 356/237.5 |
| 2003/0043372 A1 * | 3/2003 | Schulz ........................ 356/327 |
| 2004/0119970 A1 | 6/2004 | Dusa et al. ................ 356/237.1 |
| 2006/0033921 A1 | 2/2006 | Den Boef et al. ........... 356/446 |
| 2006/0066855 A1 | 3/2006 | Den Boef et al. ........... 356/401 |
| 2006/0126074 A1 | 6/2006 | Van Der Werf et al. ..... 356/489 |
| 2006/0139592 A1 | 6/2006 | Den Boef et al. ............. 355/53 |
| 2008/0135774 A1 | 6/2008 | Hugers |

FOREIGN PATENT DOCUMENTS

| | | |
|---|---|---|
| JP | 2069927 A | 3/1990 |
| WO | WO 97/22900 | 6/1997 |
| WO | WO 2006/091781 A | 8/2006 |

* cited by examiner

Intensity wavelength

Fig. 5
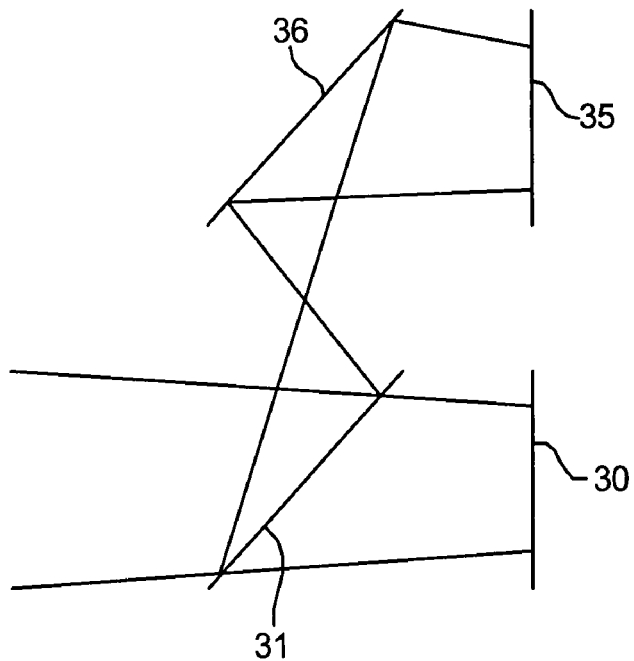
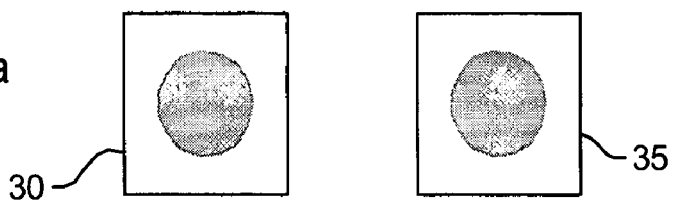
Fig. 6a
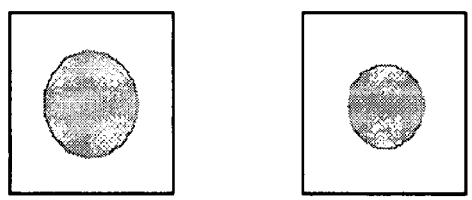
Fig. 6b
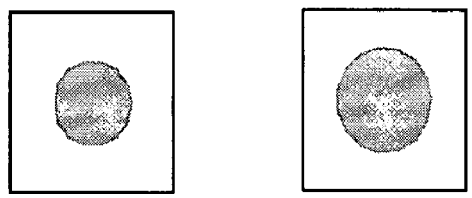
Fig. 6c

SCATTEROMETER, A LITHOGRAPHIC APPARATUS AND A FOCUS ANALYSIS METHOD

RELATED APPLICATIONS

This is a continuation-in-part application of U.S. patent application Ser. No. 11/635,787, filed Dec. 8, 2006 now abandoned, the entire contents of that application hereby incorporated by reference.

FIELD

The present invention relates to a method of inspection usable, for example, in the manufacture of devices by a lithographic technique and to a method of manufacturing devices using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To determine features of a substrate, such as its alignment, a beam is typically redirected off the surface of the substrate, for example at an alignment target, and an image is created on a camera of the redirected beam. By comparing a property of the beam before and after it has been redirected by the substrate, a property of the substrate may be determined. This can be done, for example, by comparing the redirected beam with data stored in a library of known measurements associated with a known substrate property.

SUMMARY

When detecting features of a pattern, the pattern should be in the focal plane of the optics. A method for determining whether a pattern on a substrate is in focus is the so-called "knife edge" method described in U.S. patent application publication no. US 2006-0066855, which document is hereby incorporated in its entirety by reference. However, this method may complicated and require complex parts.

It is desirable, for example, to provide a method and apparatus for detecting whether the substrate is in focus.

According to an aspect of the invention, there is provided a scatterometer configured to measure a property of a substrate, the apparatus comprising:

a high numerical aperture lens configured to project radiation onto the substrate and to project radiation redirected from the substrate towards a back focal plane of the high numerical aperture lens or towards a conjugate of a front focal plane of the high numerical aperture lens;

a first detector configured to detect a cross-sectional area of the redirected radiation having an intensity above a first value; and a second detector configured to detect a cross-sectional area of the redirected radiation having an intensity above a second value, wherein the first detector is arranged in front of the back focal plane, between the high numerical aperture lens and the back focal plane, and the second detector is arranged behind the back focal plane, or the first detector is arranged in front of the conjugate of the front focal plane, between the high numerical aperture lens and the conjugate of the front focal plane, and the second detector is arranged behind the conjugate of the front focal plane.

According to a further aspect of the invention, there is provided a measurement apparatus to measure a height of a surface of a lithographic substrate, the measurement apparatus comprising a moveable objective lens arranged to move a focal plane of a radiation beam with respect to the substrate, an aperture arranged to pass focused radiation redirected from the substrate, and a detector arranged to detect the radiation passed by the aperture, the detected radiation being a measure of the height.

According to an aspect of the invention, there is provided a lithographic apparatus comprising:

a substrate table configured to hold a substrate;

a system configured to transfer a pattern onto the substrate; and a scatterometer configured to measure a property of a substrate, the apparatus comprising:

a high numerical aperture lens configured to project radiation onto the substrate and to project radiation redirected from the substrate towards a back focal plane of the high numerical aperture lens or towards a conjugate of a front focal plane of the high numerical aperture lens, a first detector configured to detect a cross-sectional area of the redirected radiation having an intensity above a first value, and a second detector configured to detect a cross-sectional area of the redirected radiation having an intensity above a second value, wherein the first detector is arranged in front of the back focal plane, between the high numerical aperture lens and the back focal plane, and the second detector is arranged behind the back focal plane, or the first detector is arranged in front of the conjugate of the front focal plane, between the high numerical aperture lens and the conjugate of the front focal plane, and the second detector is arranged behind the conjugate of the front focal plane.

According to a further aspect of the invention, there is provided a focus analysis method for detecting whether a substrate is in the focal plane of a lens, the method comprising:

projecting radiation through a high numerical aperture lens and onto the substrate;

detecting a first cross-sectional area of radiation redirected by the substrate and passing through the high numerical aperture lens, having an intensity above a first value, the detecting the first cross-sectional area of the redirection radiation occurring between the high numerical aperture lens and a back focal plane of the high numerical aperture lens or between the high numerical aperture lens and a conjugate of a front focal plane of the high numerical aperture lens; and detecting a second cross-sectional area of the redirected radiation having an intensity above a second value, the detecting the second cross-sectional area of the redirected radiation occurring, respectively to the first detector, behind the back focal plane or behind the conjugate of the front focal plane.

According to a further aspect of the invention, there is provided a method of measuring the height of a surface of a lithographic substrate, the method comprising generating a radiation beam, using a moveable objective lens to move a focal plane of the radiation beam with respect to the substrate, passing radiation redirected from the substrate through an aperture arranged to pass focused radiation, and detecting the radiation passed by the aperture, the detected radiation being a measure of the height.

According to a further aspect of the invention there is provided a device manufacturing method comprising the focus control method described above. The focus control method described above may be implemented using a control system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts an further arrangement according to an embodiment of the invention;

FIGS. 6A and 6C depicts patterns of radiation detected on the detector when the substrate is in and out of focus;

DETAILED DESCRIPTION

Figure 1A:
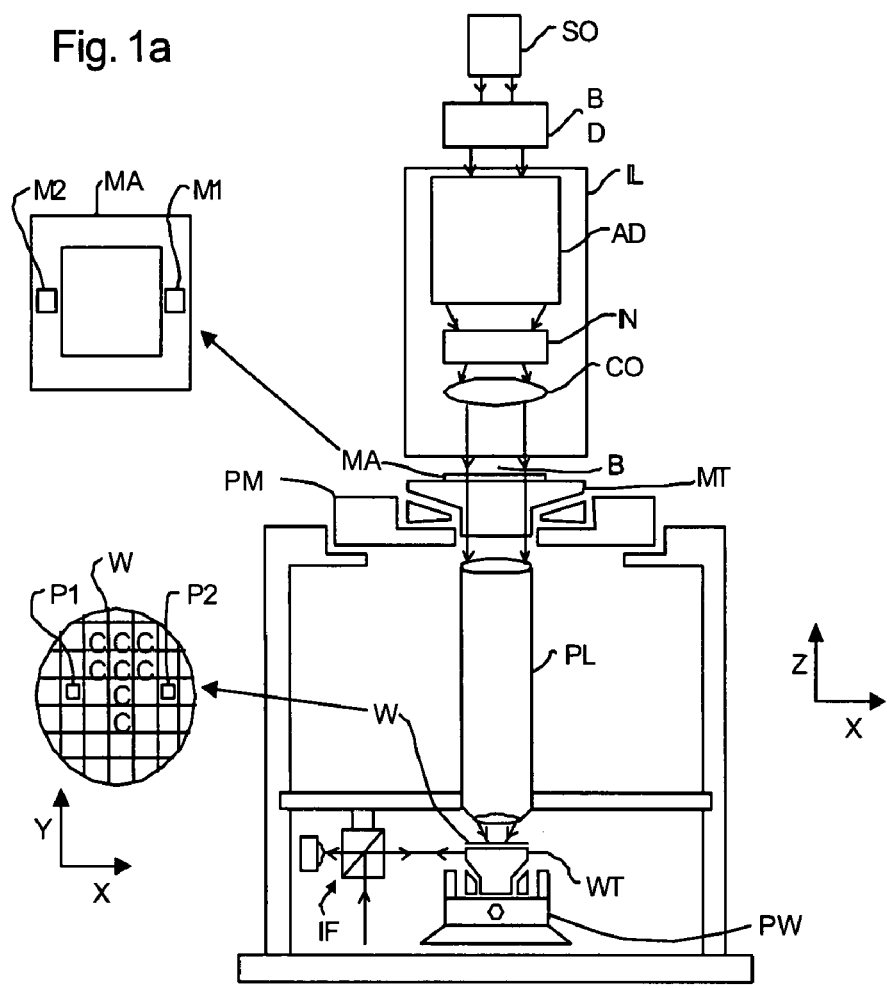
FIG. 1a depicts a lithographic apparatus.

FIG. 1a schematically depicts a lithographic apparatus. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1a) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
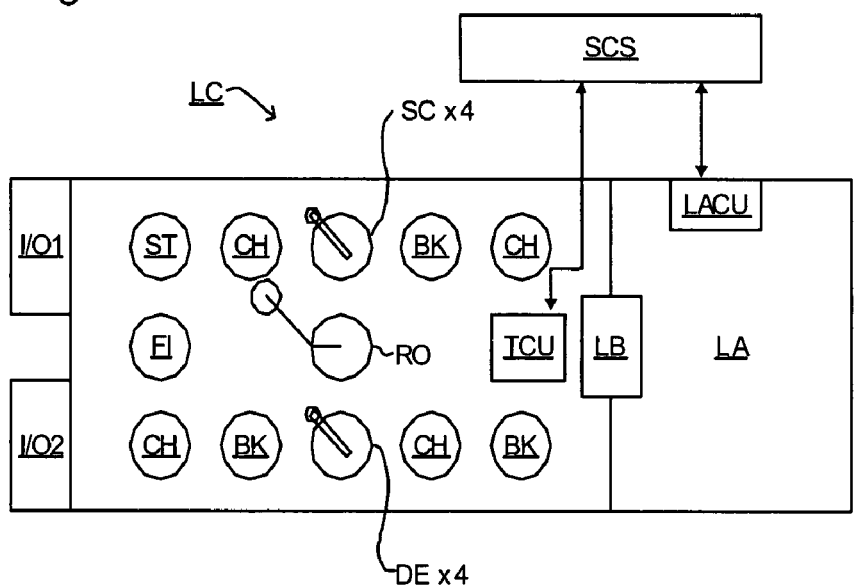
FIG. 1b depicts a lithographic cell or cluster.

As shown in FIG. 1b, the lithographic apparatus LA (controlled by a lithographic apparatus control unit LACU) forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic apparatus control unit LACU. Thus, the different apparatus may be operated to maximize throughput and processing efficiency.

In order that the substrate that is exposed by the lithographic apparatus is exposed correctly and consistently for each layer of resist, it is desirable to inspect an exposed substrate to measure one or more properties such as overlay error between subsequent layers, line thickness, critical dimension (CD), etc. If an error or change is detected, an adjustment may be made to an exposure of one or more subsequent substrates, especially if the inspection can be done soon and fast enough that another substrate of the same batch is still to be exposed. Also, an already exposed substrate may be stripped and reworked—to improve yield—or discarded—thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

Figure 2:
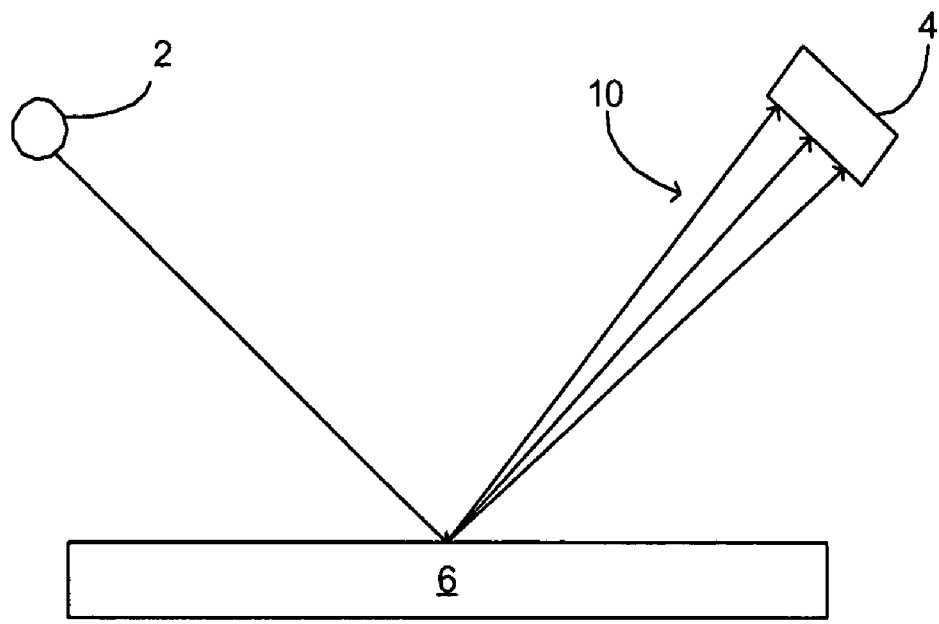
FIG. 2 depicts a scatterometer.
Figure 2:
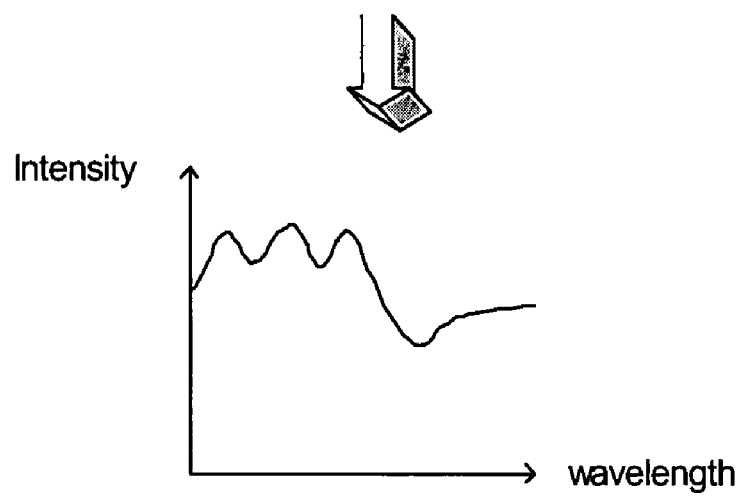
Figure 2:
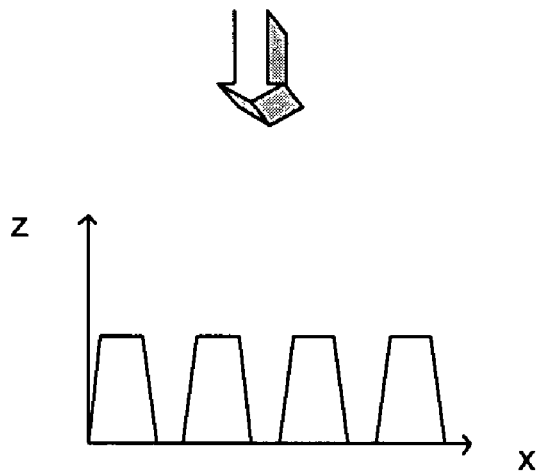

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure The one or more properties of the surface of a substrate W may be determined using a sensor such as a scatterometer such as that depicted in FIG. 2. The scatterometer comprises a broadband (white light) radiation projector 2 which projects radiation onto a substrate W. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by a processing unit, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer. A variant of scatterometry may also be used in which the reflection is measured at a range of angles of a single wavelength, rather than the reflection at a single angle of a range of wavelengths.

Figure 3:
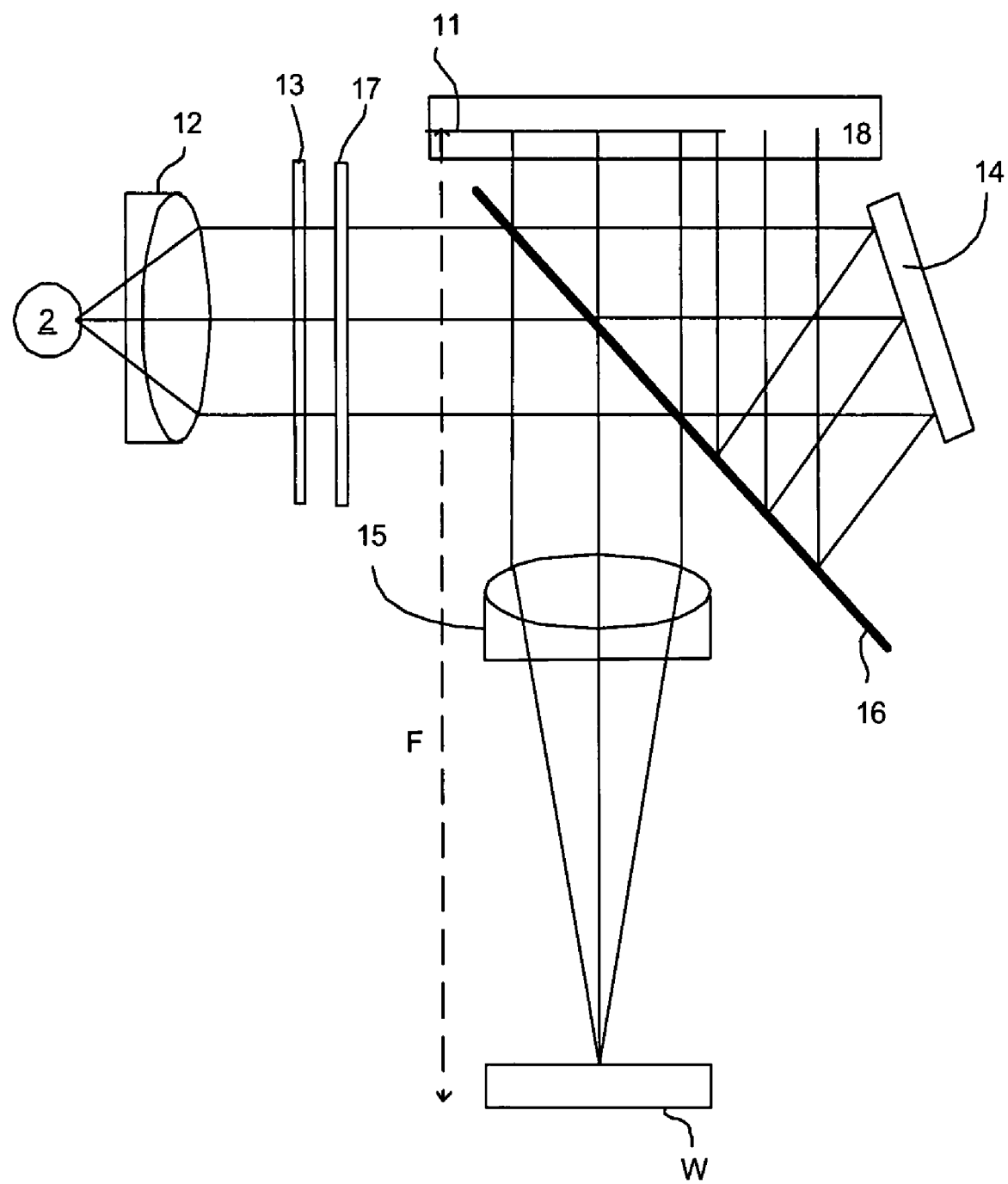
FIG. 3 depicts a further scatterometer and the general operating principle of measuring an angle resolved spectrum in the pupil plane of a high-NA lens.

A scatterometer for measuring one or more properties of a substrate may measure, in the pupil plane 11 of a high numerical aperture lens, the properties of an angle-resolved spectrum reflected from the substrate surface W at a plurality of angles and wavelengths as shown in FIG. 3. Such a scatterometer may comprise a radiation projector 2 configured to project radiation onto the substrate W and a detector 18 configured to detect the reflected spectra. The pupil plane is the plane in which the radial position of radiation defines the angle of incidence and the angular position defines azimuth angle of the radiation. The detector 14 is placed in the pupil plane of the high numerical aperture lens. The numerical aperture of the lens may be high and desirably is at least 0.9 or at least 0.95. An immersion scatterometer may even have a lens with a numerical aperture over 1.

An angle-resolved scatterometer only measures the intensity of scattered radiation. However, a scatterometer may allow several wavelengths to be measured simultaneously at a range of angles. The properties measured by the scatterometer for different wavelengths and angles may be the intensity of transverse magnetic- and transverse electric-polarized radiation and/or the phase difference between the transverse magnetic- and transverse electric-polarized radiation.

Using a broadband radiation source (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

A scatterometer that may be used with an embodiment of the present invention is shown in FIG. 3. The radiation of the radiation projector 2 is collimated using lens system 12 through interference filter 13 and polarizer 17, reflected by partially reflective surface 16 and is focused onto substrate W via a microscope objective lens 15. The reflected radiation is then transmitted through partially reflective surface 16 into a CCD detector 18 in the back projected pupil plane 11 in order to have the scatter spectrum detected. The pupil plane 11 is at the focal length of the lens system 15. A detector and high aperture lens are placed at the pupil plane. The pupil plane may be re-imaged with auxiliary optics since the pupil plane of a high-NA lens is usually located inside the lens.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

The pupil plane of the reflected radiation is imaged on the CCD detector, which may have an integration time of, for example, 40 milliseconds per frame. In this way, a two-dimensional angular scatter spectrum of the substrate target is imaged on the detector. The detector may be, for example, an array of CCD or CMOS sensors.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit, from knowledge of the printing step and/or other scatterometry processes.

Figure 4A:
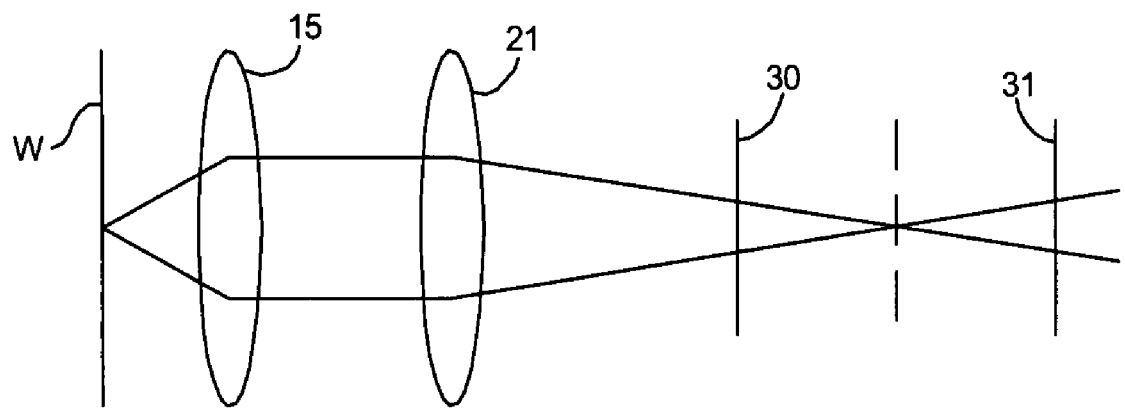
FIGS. 4a and 4b depict arrangements according to an embodiment of the invention.

FIG. 4a depicts an arrangement according to an embodiment of the invention in which radiation is projected through the high numerical aperture lens 15 and through a focusing lens 21. The radiation is then projected onto a first detector 30 and a second detector 31. As described below, each of the detectors detects an amount (or cross-sectional area) of radiation above a predetermined intensity level. Each of the detectors may comprise one or more photodiodes, CCDs or CMOS. In this embodiment, the detectors are at least partially transmissive such that radiation is transmitted through the detectors and onto one or more further optical elements. The detectors are desirably arranged equidistant along the optical path from the back focal plane of the high numerical aperture lens 15 or equidistant from a conjugate of the substrate plane, shown as the dashed line in FIG. 4a. Assuming no transmissive losses between the detectors, if the substrate is in focus the cross-sectional area of the radiation above a predetermined intensity level (the spot size) will be the same at both detectors, as shown in both columns in FIG. 6a, and a simple comparator can be used to determine whether the substrate is in focus. However, if the substrate is out of focus by being too far from the high numerical aperture lens, the spot size will be greater in the first detector (shown in the left column in FIG. 6b) than the second detector (shown in the right column in FIG. 6b). Conversely, if the substrate is out of focus by being to close to the high numerical aperture lens, the spot size in the second detector (shown in the right column in FIG. 6c) will be greater than that in the first detector (shown in the left column in FIG. 6c).

Figure 4B:
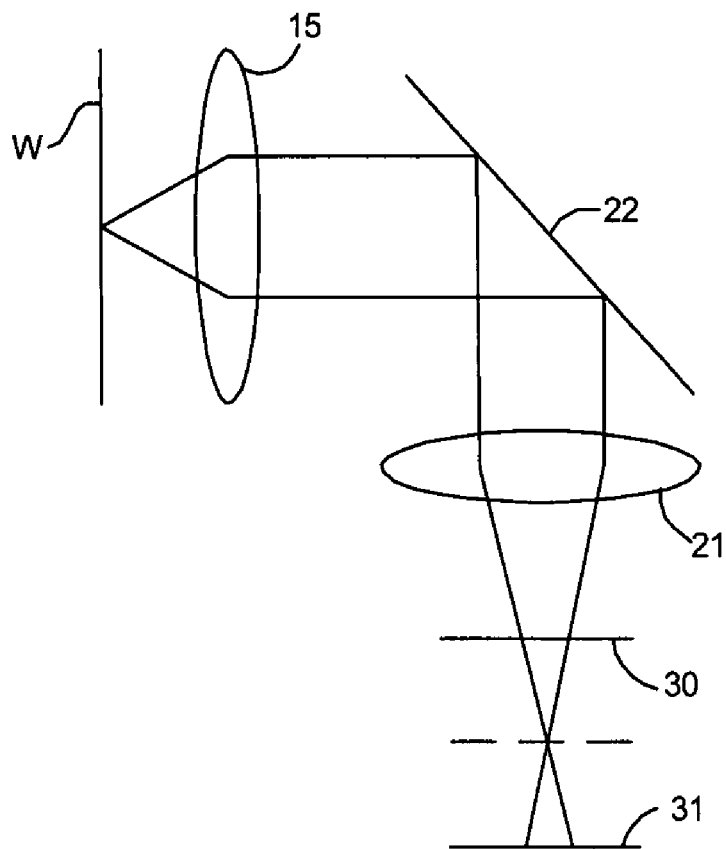

A further arrangement according to an embodiment of the invention is shown in FIG. 4b. In this embodiment, a partially transmissive mirror 22 is placed in the path of the beam after the high numerical aperture lens 15. The partially transmissive mirror 22 deflects a portion of the radiation towards a focus branch which includes the focusing lens 21 together with first detector 30 and second detector 31. In this embodiment the first detector 30 and second detector 31 are placed either side and desirably equidistant of a conjugate of the substrate plane (a conjugate of the front focal plane of the high numerical aperture lens). The second detector need therefore not be partially transmissive. As an alternative to the transmissive mirror, a beam splitter could also be used.

The predetermined intensity levels measured on the first and second detectors may not be the same. For example, if there are transmissive losses between the first and second detectors, the predetermined intensity level above which radiation is measured may be greater for the first detector than the second detector. Some calibration may be required to determine the desired predetermined intensity levels.

Figure 7A:
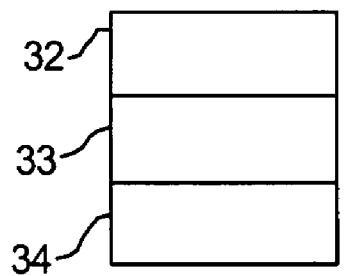
FIGS. 7A and 7B depict detectors according to an embodiment of the invention.
Figure 7B:
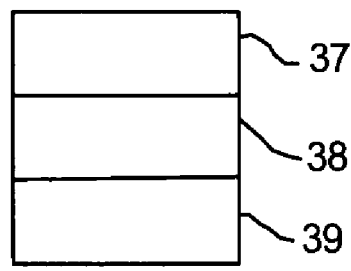

Although these examples have just a first detector 30 and a second detector 31, each of the first detector and second detector could be divided into a plurality of sub-detectors as shown in FIGS. 7a and 7b. FIG. 7a depicts the first detector divided into a plurality of first sub-detectors, 32, 33, 34 and FIG. 7b depicts the second detector divided into a plurality of second sub-detectors 37, 38, 39. The focus area is then given by:

$$(I_{32}+I_{34}+I_{38})-(I_{33}+I_{37}+I_{39})$$

where $I_{32}$ is the amount of radiation above a first predetermined intensity level incident on sub-detector 32, $I_{37}$ is the amount of radiation about a second predetermined intensity level incident on sub-detector 37, etc.

Figure 8:
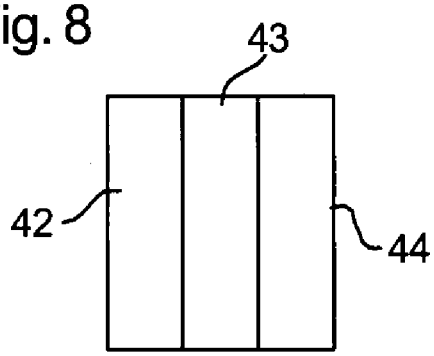
FIGS. 8 to 10 depict further detectors according to an embodiment of the invention.
Figure 9:
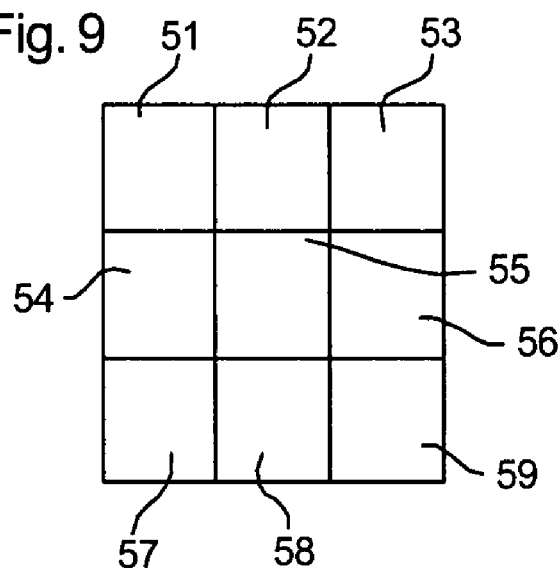
Figure 10:
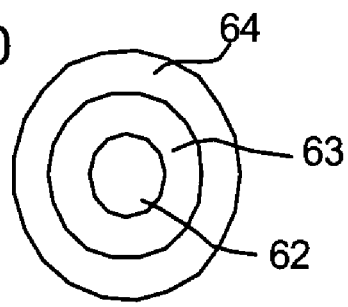

Although FIGS. 7a and 7b depict the first and second detectors divided into sub-detectors along a horizontal direction, the detectors could be divided into sub-detectors in any number of ways. For example, FIG. 8 depicts a detector divided into sub-detectors 42, 43, 44 along a vertical direction. FIG. 9 depicts a detector divided into sub-detectors 51 to 59 in a grid arrangement and FIG. 10 depicts a detector divided into sub-detectors 62, 63, 64 in concentric circles.

FIG. 5 depicts a further arrangement of the detectors shown in FIG. 4. In this embodiment, mirrors are used to project the radiation onto the detectors. A partially reflective mirror 35 allows part of the radiation to pass through and onto first detector 30 while the remaining radiation reflects towards a second mirror 36 which reflects at least part of the radiation onto the second detector 31. The second mirror 36 may be either fully reflective or partially reflective and the second detector 31 may be transmissive to allow the radiation to be projected onto further optics. Again, the detectors are desirably arranged equidistant along the path of the radiation from the back focal plane of the high numerical aperture lens 15 or equidistant from a conjugate of the substrate plane.

Although the detectors are desirably arranged equidistant along the path of the radiation from the back focal plane of the high numerical aperture lens 15 or from a conjugate of the substrate plane, they need not be. If they are not equidistant from the back focal plane or a conjugate of the substrate plane, a calculation, rather than a simple comparison, may determine whether the relative spot sizes on the detectors indicate that the substrate is in focus or out of focus.

This method can be used in conjunction with an other, conventional focus detection method. For example, one or more different focus detection methods may occupy different optical branches.

Figure 11:
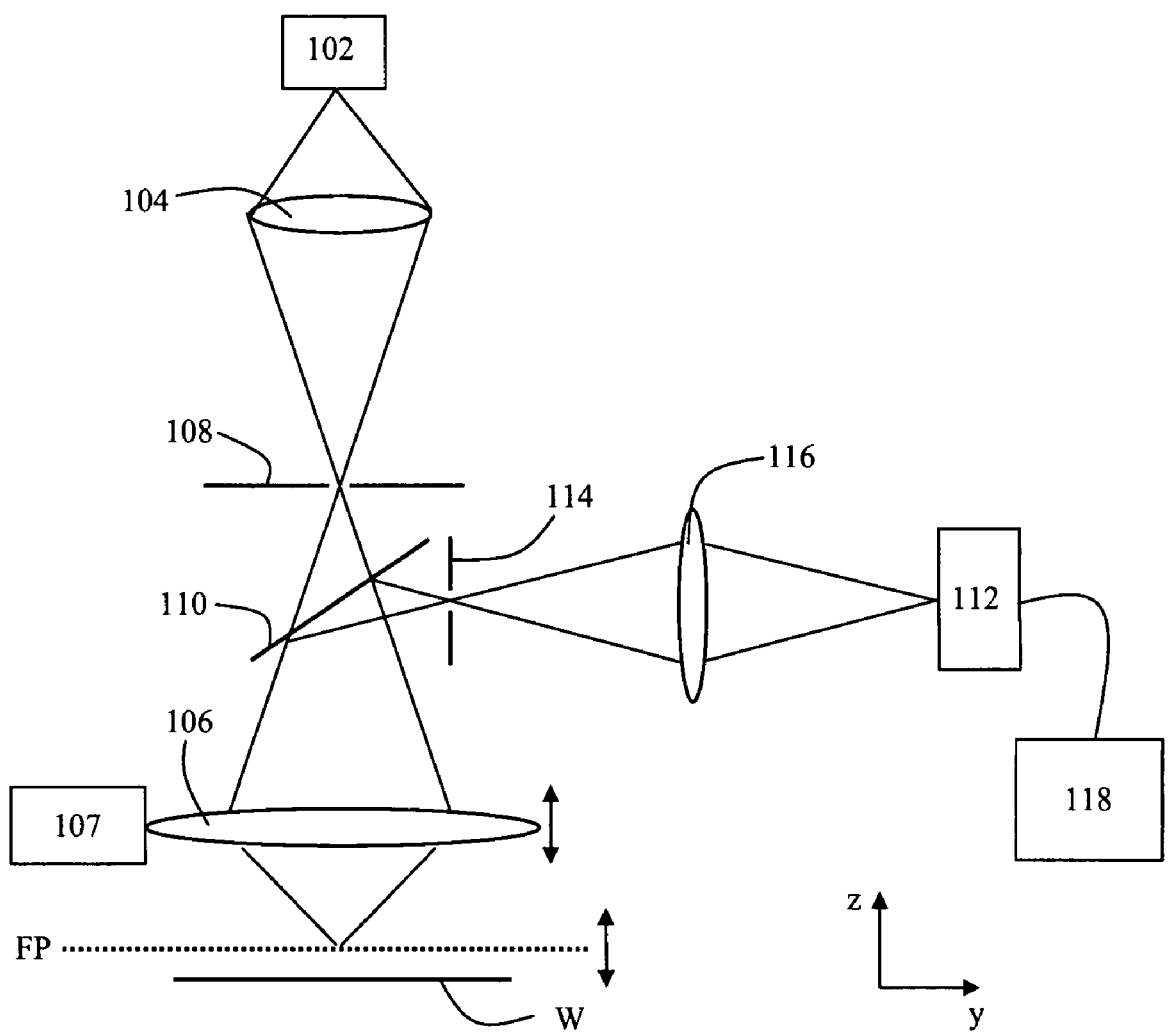
FIG. 11 depicts a further embodiment of the invention.

An further embodiment of the invention is shown in FIG. 11, which schematically shows a measurement apparatus which may be used to monitor the height (i.e. position in the z-direction) of an uppermost surface of a substrate W. The height may be measured, for example, with respect to a reference plane (not shown), or with respect to an objective lens 106 of the apparatus.

The apparatus comprises a radiation source 102 which provides a beam of radiation (although the radiation source need not be part of the apparatus). The radiation source 102 may, for example, be a laser (e.g. a diode laser). It is not essential that the radiation source is a laser; any suitable source may be used. A broadband radiation source may be used. Multiple radiation sources operating at different wavelengths may be used.

The apparatus further comprises a pair of lenses 104, 106 arranged to focus radiation from the radiation source to a focal plane FP. The second of these lenses will be referred to here as the objective lens 106 since it is located adjacent to the substrate W.

The objective lens 106 is connected to an actuator 107 which is arranged to move the objective lens in the z-direction (as indicated by a double headed arrow). The focal plane FP of the objective lens 106 thus also moves in the z-direction (also indicated by a double headed arrow).

An aperture 108 is provided in a focal plane located between the lenses 104, 106. The aperture provides spatial filtering of the radiation beam. That is to say, it removes aberration from the radiation beam. It is not essential that an aperture be provided (the intensity profile of the radiation beam may be sufficiently good without requiring an aperture to be used). The aperture is most effective when the radiation source 102 is a laser.

A beam splitter 110 is located after the aperture in the path of the radiation from the radiation source 102, and is arranged to direct towards a detector 112 radiation which has been reflected and/or diffracted from the substrate W. An aperture 114 is located at a focal plane of the second lens 106. The width (e.g., diameter) of the aperture 114 may be matched with the width (e.g., diameter) of the radiation beam in the plane of the aperture 114. The aperture 114 should be sufficiently large that when the upper surface of the substrate W is located in the focal plane FP of the objective lens 106, then substantially all of the radiation beam passes through the aperture 114. In other words, the aperture 114 width may be substantially equal to the width of the radiation beam when the radiation beam is focused onto the upper surface of the substrate W.

A third lens 116 focuses the radiation that passes the aperture 114 onto the detector 112. The detector may, for example, be a photodiode. An output from the detector 112 may pass to a controller 118.

In use, radiation emitted by the radiation source 102 is focused onto the focal plane FP by the objective lens 106. The objective lens 106 moves towards and away from the substrate W (i.e. in the z-direction), so that the focal plane moves from being above the substrate to being aligned with the substrate to being below the substrate. The source 102 and the lenses 104, 106 may be arranged such that the width (e.g., diameter) of the radiation beam when it is focused on the substrate (i.e. the width of the beam spot) is the same as the width (e.g., diameter) of the radiation beam used by the scatterometer (the scatterometer is described above in relation to FIG. 3). It is not essential that the widths are the same. The widths may differ, for example, by up to one order of magnitude.

The movement of the focal plane FP means that the radiation is not always focused to a point on the substrate W. Instead, when the focal plane FP is above the substrate the radiation incident upon the substrate W is defocused. This defocusing is reduced as the focal plane FP moves towards the substrate W. The radiation is focused when the focal plane FP is aligned with the substrate W. It then becomes defocused again when the focal plane FP moves below the substrate W.

Radiation which is reflected or diffracted from the substrate W passes via the beam splitter 110 to the aperture 114. The aperture 114 is located at a focal plane of the objective lens 106. The intensity of radiation which passes through the aperture 114 will depend upon the extent to which the radiation was focused on the substrate W by the objective lens 106. For example, if the radiation incident on the substrate W is defocused then a lesser intensity of radiation will pass through the aperture 114 than if the radiation incident on the substrate W was focused on the substrate W.

The third lens 116 focuses onto the detector 112 radiation which has passed the aperture 114. The output from the detector 112 therefore provides an indication of when the upper surface of the substrate W is aligned with the focal plane FP of the objective lens 106. This may be used to monitor the height (i.e. the position in the z-direction) of the upper surface of the substrate W with respect to objective lens 106 (or some other reference plane).

Although the substrate is shown as being flat in FIG. 11, it is likely to have some surface structure arising from layers which have been provided on the substrate (for example patterned layers). The different layers may have different properties, and some of the layers may be semi-transparent. The apparatus shown in FIG. 11 provides a measurement of the height of the upper surface of the substrate which includes these layers. This is a useful measurement because it may allow optimal operation of the scatterometer (for example as shown in FIG. 3) to be achieved, by allowing the radiation beam of the scatterometer to be correctly focused on the upper surface of the substrate.

Once the height of the upper surface of the substrate W has been determined, the radiation beam used by the scatterometer (see FIG. 3) may be correctly focused onto the upper surface of the substrate W. The controller 118 may achieve this by moving the substrate W in the z-direction by an appropriate amount based upon the output of the detector 112. This may be done, for example, by moving a substrate table (not illustrated) upon which the substrate rests.

Alternatively (or additionally), the controller 118 may be arranged to move the focal plane of the scatterometer. This may be achieved, for example, by moving the objective lens 15 of the scatterometer.

The substrate height measurement performed by the apparatus shown in FIG. 11 may be performed at a substrate location which is a predetermined distance away from a substrate location which is measured by the scatterometer. The substrate may be moved in a scanning motion (e.g. in the y-direction) beneath the measurement apparatus and the scatterometer, such that a predetermined time will elapse between the substrate height measurement taking place and the scatterometer measurement taking place. A corresponding time delay may be introduced between the measurement of the substrate height and any required movement of the substrate (and/or the objective lens of the scatterometer).

The measurement apparatus shown in FIG. 11 may be combined with the scatterometer shown in FIG. 3, for example such that both of them share a single objective lens (objective lens 15). Where this is done, no time delay is required between measurement of the substrate height and any required movement of the substrate (or the objective lens of the scatterometer).

When measuring the substrate height the controller 118 may take into account any movement of the substrate W which takes place in the z-direction.

In the description of FIG. 11, the term 'height' has been used to refer to the position of the upper surface of the substrate W in the z-direction. However, it is not essential that the substrate be horizontal, and so it is not essential that the surface of the substrate be facing upwards (the substrate may, for example, be vertically oriented). Therefore, the term height should be understood to mean the position of the surface of the substrate with respect to a reference plane that is substantially parallel to the surface of the substrate. This reference plane need not necessarily lie perpendicular to the z-direction. For similar reasons, terms such as above and below should be appropriately modified depending on the orientation of the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

I claim:

1. A scatterometer configured to measure a property of a substrate, the apparatus comprising:
   a high numerical aperture lens configured to project radiation onto the substrate and to project radiation redirected from the substrate towards a back focal plane of the high numerical aperture lens or towards a conjugate of a front focal plane of the high numerical aperture lens;
   a first detector configured to detect a first cross-sectional area of the redirected radiation having an intensity above a first value; and
   a second detector configured to detect a second cross-sectional area of the redirected radiation having an intensity above a second value,
   wherein the first detector is arranged in
      front of the back focal plane, between the high numerical aperture lens and the back focal plane, and the second detector is arranged behind the back focal plane, or the first detector is arranged in
      front of the conjugate of the front focal plane, between the high numerical aperture lens and the conjugate of the front focal plane, and the second detector is arranged behind the conjugate of the front focal plane.

2. The scatterometer of claim 1, further comprising an angle detector configured to detect an angle resolved spectrum of the redirected radiation.

3. The scatterometer of claim 1, wherein the first detector and the second detector are arranged equidistant from the back focal plane or the conjugate of the front focal plane along an optical path of the redirected radiation.

4. The scatterometer of claim 1, further comprising a comparator configured to compare a size of the first cross-sectional area of the redirected radiation having an intensity above the first value detected by the first detector and a size of the second cross-sectional area of the redirected radiation having an intensity above the second value detected by the second detector.

5. The scatterometer of claim 1, further comprising a first reflector configured to reflect the redirected radiation towards the first detector.

6. The scatterometer of claim 5, wherein the first reflector comprises a partially reflective mirror.

7. The scatterometer of claim 1, further comprising a second reflector configured to reflect the redirected radiation towards the second detector.

8. The scatterometer of claim 7, wherein the second reflector comprises a partially reflective mirror.

9. The scatterometer of claim 1, wherein the first detector comprises a plurality of first sub-detectors.

10. The scatterometer of claim 1, wherein the second detector comprises a plurality of second sub-detectors.

11. The scatterometer of claim 1, wherein the first value is the same as the second value.

12. The scatterometer of claim 1, wherein the first value is greater than the second value.

13. A lithographic apparatus comprising:
   a substrate table configured to hold a substrate;
   a system configured to transfer a pattern onto the substrate; and
   a scatterometer configured to measure a property of a substrate, the apparatus comprising:
      a high numerical aperture lens configured to project radiation onto the substrate and to project radiation redirected from the substrate towards a back focal plane of the high numerical aperture lens or towards a conjugate of a front focal plane of the high numerical aperture lens,
      a first detector configured to detect a first cross-sectional area of the redirected radiation having an intensity above a first value, and
      a second detector configured to detect a second cross-sectional area of the redirected radiation having an intensity above a second value,
   wherein the first detector is arranged in
   front of the back focal plane, between the high numerical aperture lens and the back focal plane, and the second detector is arranged behind the back focal plane, or the first detector is arranged in
   front of the conjugate of the front focal plane, between the high numerical aperture lens and the conjugate of the front focal plane, and the second detector is arranged behind the conjugate of the front focal plane.

14. A measurement apparatus to measure a height of a surface of a lithographic substrate, the measurement apparatus comprising:
   a moveable objective lens arranged to move a focal plane of a radiation beam in a direction substantially perpendicular with respect to a plane of the substrate;
   an aperture arranged to pass focused radiation redirected from the substrate; and
   a detector arranged to detect the radiation passed by the aperture, the detected radiation being a measure of the height.

15. The measurement apparatus of claim 14, further comprising a controller arranged to monitor the output of the detector, and to apply an adjustment to a scatterometer arranged to measure a property of the substrate, the adjustment being arranged to compensate for the measured height of the substrate.

16. The measurement apparatus of claim 14, further comprising a controller arranged to monitor the output of the detector, and to apply an adjustment to a position of the substrate to compensate for the measured height of the substrate.

17. A focus analysis method for detecting whether a substrate is in the focal plane of a lens, the method comprising:
projecting radiation through a high numerical aperture lens and onto the substrate;
detecting a first cross-sectional area of radiation redirected by the substrate and passing through the high numerical aperture lens, having an intensity above a first value, the detecting the first cross-sectional area of the redirection radiation occurring between the high numerical aperture lens and a back focal plane of the high numerical aperture lens or between the high numerical aperture lens and a conjugate of a front focal plane of the high numerical aperture lens; and
detecting a second cross-sectional area of the redirected radiation having an intensity above a second value, the detecting the second cross-sectional area of the redirected radiation occurring, respectively to the first detector, behind the back focal plane or behind the conjugate of the front focal plane.

18. The method of claim 17, further comprising comparing a size of the first cross-sectional area of the redirected radiation and a size of the second cross-sectional area of the redirected radiation.

19. The method of claim 17, further comprising detecting angles of a spectrum of redirected radiation.

20. A method of measuring the height of a surface of a lithographic substrate, the method comprising:
generating a radiation beam;
using a moveable objective lens to move a focal plane of the radiation beam in a direction substantially perpendicular with respect to a plane of the substrate;
passing radiation redirected from the substrate through an aperture arranged to pass focused radiation; and
detecting the radiation passed by the aperture, the detected radiation being a measure of the height.

21. The method of claim 20, further comprising applying an adjustment to a scatterometer arranged to measure a property of the substrate, the adjustment being arranged to compensate for the measured height of the substrate.

22. The method of claim 20, further comprising applying an adjustment to a position of the substrate to compensate for the measured height of the substrate.

23. A device manufacturing method, comprising:
projecting a patterned beam of radiation onto a substrate; and
detecting whether a substrate is in the focal plane of a lens, the detecting comprising:
projecting radiation through a high numerical aperture lens and onto the substrate;
detecting a first cross-sectional area of radiation redirected by the substrate and passing through the high numerical aperture lens, having an intensity above a first value, the detecting the first cross-sectional area of the redirection radiation occurring between the high numerical aperture lens and a back focal plane of the high numerical aperture lens or between the high numerical aperture lens and a conjugate of a front focal plane of the high numerical aperture lens; and
detecting a second cross-sectional area of the redirected radiation having an intensity above a second value, the detecting the second cross-sectional area of the redirected radiation occurring, respectively to the first detector, behind the back focal plane or behind the conjugate of the front focal plane.

24. The method of claim 23, further comprising comparing a size of the first cross-sectional area of the redirected radiation and a size of the second cross-sectional area of the redirected radiation.

25. A control system configured to control a lithographic apparatus, the control system embodying executable instructions configured to carry out a focus analysis method for detecting whether a substrate is in the focal plane of a lens, the method comprising:
projecting radiation through a high numerical aperture lens and onto the substrate;
detecting a first cross-sectional area of radiation redirected by the substrate and passing through the high numerical aperture lens, having an intensity above a first value, the detecting the first cross-sectional area of the redirection radiation occurring between the high numerical aperture lens and a back focal plane of the high numerical aperture lens or between the high numerical aperture lens and a conjugate of a front focal plane of the high numerical aperture lens; and
detecting a second cross-sectional area of the redirected radiation having an intensity above a second value, the detecting the second cross-sectional area of the redirected radiation occurring, respectively to the first detector, behind the back focal plane or behind the conjugate of the front focal plane.

* * * * *